(12) United States Patent
Cohen

(10) Patent No.: US 7,355,909 B2
(45) Date of Patent: Apr. 8, 2008

(54) COLUMN REDUNDANCY REUSE IN MEMORY DEVICES

(75) Inventor: Zeev Cohen, Zichron-Yaakov (IL)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 101 days.

(21) Appl. No.: 11/179,358

(22) Filed: Jul. 12, 2005

(65) Prior Publication Data

US 2007/0014165 A1 Jan. 18, 2007

(51) Int. Cl.
*G11C 7/00* (2006.01)
(52) U.S. Cl. .................. 365/200; 365/185.09; 711/202
(58) Field of Classification Search ................ 365/200, 365/185.09; 711/202, 209
See application file for complete search history.

(56) References Cited

U.S. PATENT DOCUMENTS

| | | | | |
|---|---|---|---|---|
| 5,347,484 A | * | 9/1994 | Kwong et al. ................ 365/49 |
| 5,572,470 A | * | 11/1996 | McClure et al. ............ 365/200 |
| 5,970,003 A | | 10/1999 | Miyatake et al. | |
| 6,894,922 B1 | | 5/2005 | Hidaka | |

* cited by examiner

*Primary Examiner*—Huan Hoang
*Assistant Examiner*—Michael Weinberg
(74) *Attorney, Agent, or Firm*—Slater & Matsil, L.L.P.

(57) ABSTRACT

A method for column redundancy re-use includes arranging the memory array into a plurality of addressable first array columns and a plurality of addressable second array columns. The column redundancy structure is also arranged into an addressable first redundancy column and an addressable second redundancy column. A first column array which is found to be defective is replaced by mapping its address to the first redundancy column. In a similar manner, a second column array which is found to be defective is replaced by mapping its address to the second redundancy column.

12 Claims, 5 Drawing Sheets

COLUMN REDUNDANCY REUSE IN MEMORY DEVICES

TECHNICAL FIELD

The present invention relates to memory devices, and more particularly to a memory device architecture and method for reusing column redundancy structures therein.

BACKGROUND

FIG. 1 illustrates a conventional memory device 100 in which column redundancy is used to bypass defects in a memory array. In a typical implementation, the device 100 includes a quarter memory array 110, and one or more adjacent column redundancy ("CR") structures 120. The memory array 110 includes numerous column arrays, each of which are coupled to a further number of memory cells (not shown). In memory devices which use matched loading of sense- and reference-side signals, the CR structure 120 will include two addressable columns or "slices" (conventionally referred to as an "even" and "odd slices"), which are designed to replace sense and load side columns that correspond to a defective array column.

Once a defective array column 112 is identified, it is bypassed by mapping the address of the defective column to the address of one of the slices within the CR structure 120. The address of the defective array column 112 may be routed to either of the even or odd CR slices, and the reference or load signal is address mapped to the remaining CR slice in the CR structure 120. An array controller (not shown) typically performs the address mapping functions. The CR structure 120 then serves as a replacement for the defective array column 112 during operation of the memory device 100, whereby one of the CR slices serves as the storage or sense side of the defective array column 112, and the other CR slice serving as the reference or load side associated with the defective array column 112.

While effective in replacing defective column arrays, the conventional approach suffers from disadvantages resulting from the single and dedicated use of a CR structure to replace one column defect. In particular, while the CR structure 120 includes two columns capable of storage, only one slice is used for memory storage; the second slice being used only as a reference or load for the first slice. Accordingly, fifty percent of the CR structure 120 goes unused.

What is therefore needed is an improved memory device architecture and corresponding method for re-using CR structures to replace column defects in a memory device.

SUMMARY OF THE INVENTION

The present invention provides a new memory device architecture and method of column redundancy re-use for replacing defective column arrays. The invention can be used to provide higher chip yield when the same number of re-usable CR structures are implemented in place of the convention non-reusable CR structures, as a comparatively greater number of column defects can be replaced with the re-usable CR structures. Alternatively, as fewer of the re-usable CR structures can be used to replace the same number of total column defects, the total number of CR structures can be reduced from the conventional memory device, resulting in a comparably small die size.

An exemplary method for column redundancy re-use includes arranging the memory array into a plurality of addressable first array columns and a plurality of addressable second array columns. The column redundancy structure is also arranged into an addressable first redundancy column and an addressable second redundancy column. A first column array which is found to be defective is replaced by mapping its address to the first redundancy column. In a similar manner, a second column array which is found to be defective is replaced by mapping its address to the second redundancy column.

These and other features of the invention will be better understood when taken in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which.

Figure 1:
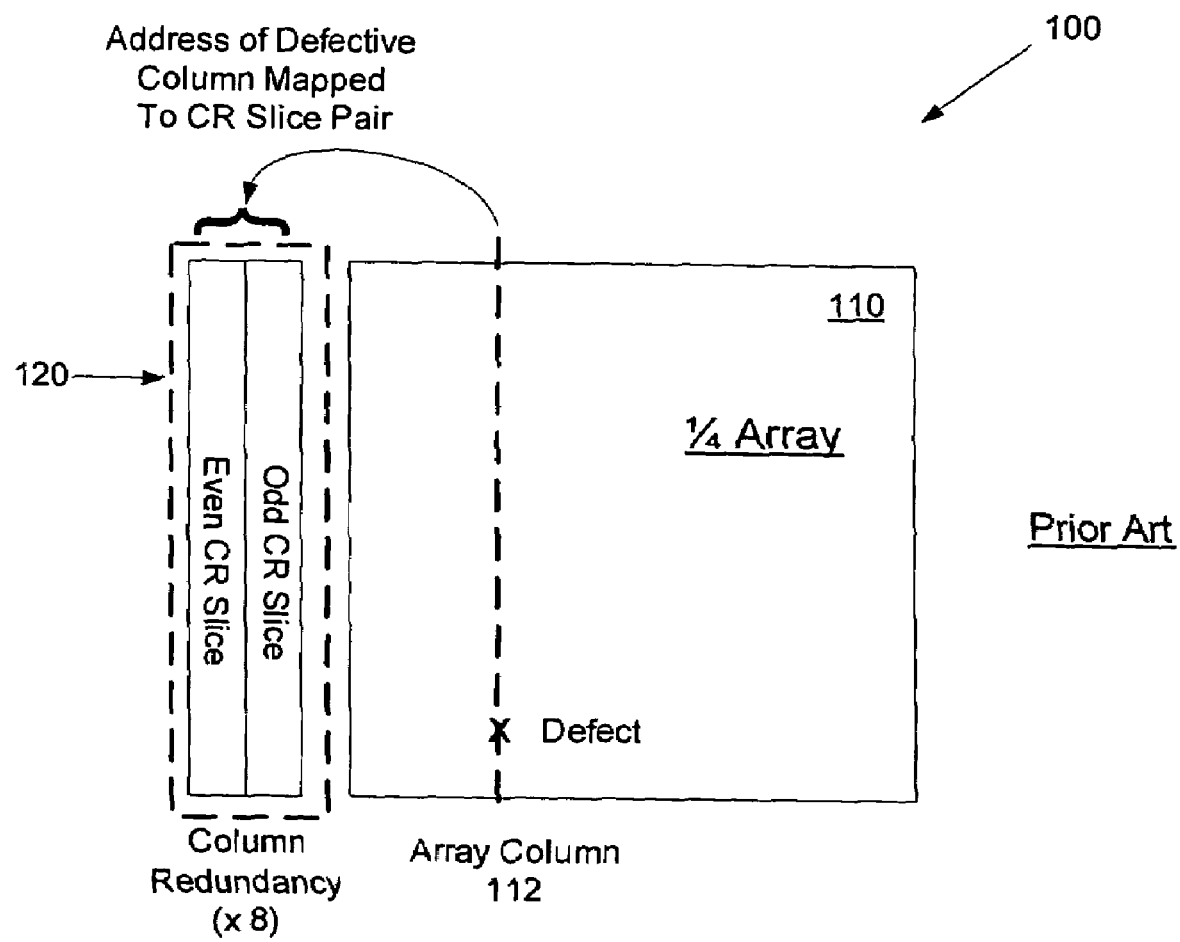
FIG. 1 illustrates a conventional memory device in which a column redundancy structure is used to replace a defective memory array column.

For clarity, previously defined features retain their reference numerals in subsequent drawings.

DETAILED DESCRIPTION OF ILLUSTRATIVE EMBODIMENTS

Figure 2A:
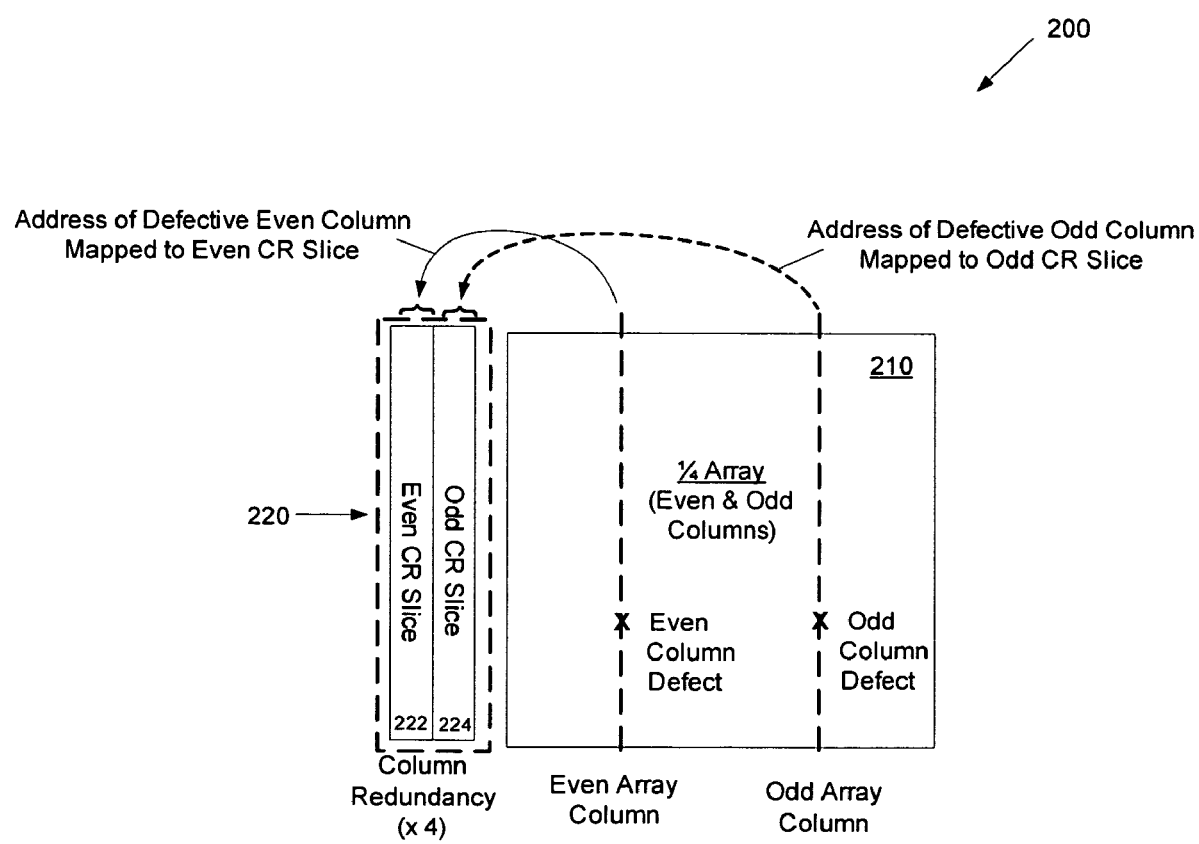
FIG. 2A illustrates a memory device in which a column redundancy structure can be re-used to replace defective memory array columns in accordance with one embodiment of the present invention.

FIG. 2A illustrates a memory device 200 in which a column redundancy structure can be re-used to replace defective memory array columns in accordance with one embodiment of the present invention. The memory device 200 includes a memory array 210, shown as a "quarter array" as known in the art, and a column redundancy (CR) structure 220.

As will be further described below, the memory array 210 is arranged into a group of addressable first (e.g., "even") columns, and a group of addressable second (e.g., "odd") columns. In a particular embodiment, the arrangement or sub-division of the total number of memory columns provides substantially an equal number of the first and second columns. A larger or smaller number of columns belonging to one group may be implemented in an alternative embodiment under the present invention.

The CR structure 220 is similarly divided into an addressable first redundancy column (or "even slice") 222 and an addressable second redundancy column (or "odd slice") 224. During a column replacement operation, the address of a defective column is mapped to the CR slice of the same type; e.g., the address of a defective even column is re-mapped to the address of the even CR slice 222, and the address of a defective odd column is mapped to the address of the odd CR slice 224. In a particular embodiment further described below, the remaining CR slice is used as a reference for the mapped array column, for example, the address of the reference path/column corresponding to the defective even column is mapped to the address of the odd CR slice 224, and the address of the reference path/column corresponding to the defective odd column is mapped to the address of the even CR slice 222. Also as shown, only four CR structures 220 are implemented per quarter array, compared to eight CR structures of the conventional quarter array in FIG. 1 due to the re-usable properties of the CR structures 220 in the present invention.

Figure 2B:
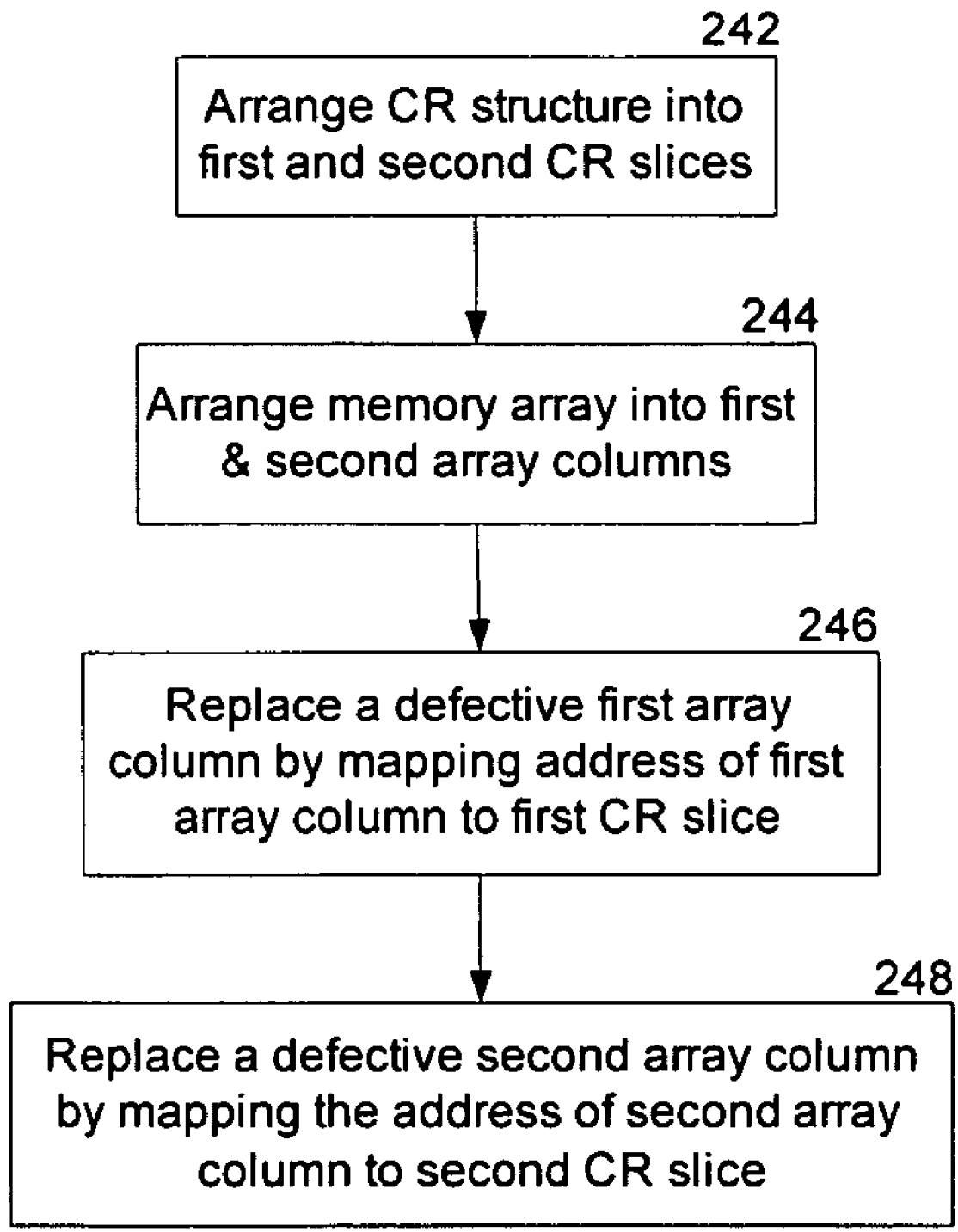
FIG. 2B illustrates a method for column redundancy structure re-use as implemented in the memory device of FIG. 2A.

FIG. 2B illustrates a method for column redundancy structure re-use as implemented in the memory device of FIG. 2A. Initially at 242, the CR structure 220 is arranged or sub-divided into first and second redundancy columns, e.g., "even and odd CR slices." At 244, the memory array 210 is arranged or sub-divided into a first group and a second group of array columns, e.g., "even and odd array columns."

At 246 of FIG. 2B during a first column replacement operation, a defective even array column is replaced using the CR structure 220, whereby the address of the even array column is mapped to the address of the even CR slice 222. In a particular embodiment further described below, an array controller is operable to perform the address re-mapping. At 248 during a second column replacement operation, a defective odd array column is replaced using the CR structure 220, whereby the address of the odd array column is mapped to the address of the odd CR slice 224, the address re-mapping being performed by the array controller. In this manner, a single CR structure 220 can be re-used to replace defective memory array columns.

Figure 3A:
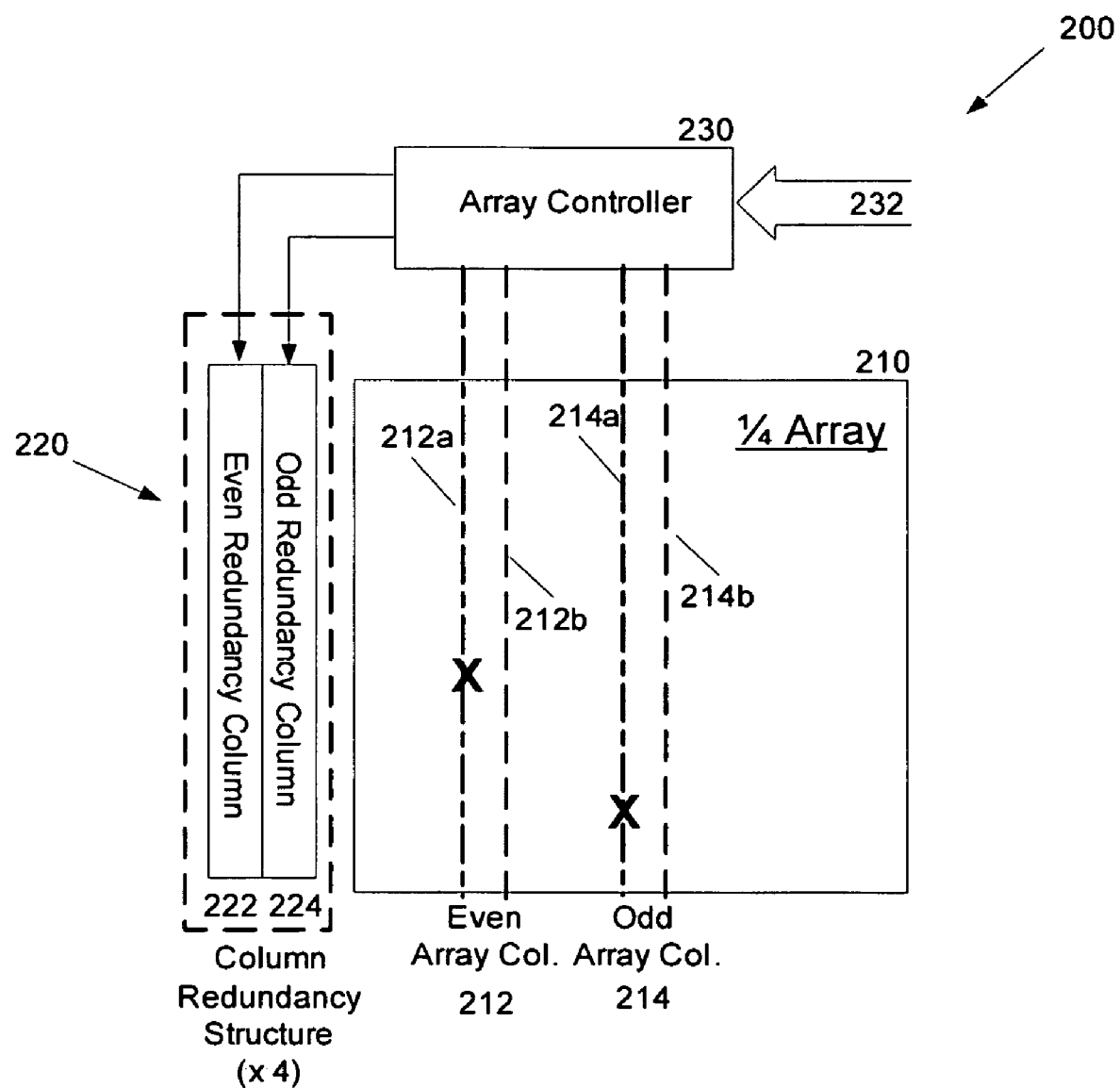
FIG. 3A illustrates a matched load memory device in which a column redundancy structure can be re-used to replace defective memory array columns in accordance with one embodiment of the present invention.

FIG. 3A illustrates a matched load memory device 210, in which a column redundancy structure 220 can be re-used to replace defective memory array columns 212 and 214 in accordance with one embodiment of the present invention. As is shown, defective even array column 212 includes a sense path 212a and a reference path 212b. The reference path 212b is configured to have substantially the same loading characteristics of the sense path 212a and is used as a reference to ascertain current conditions of the sense path 212a as known in the art. Defective odd array column 214 similarly includes a sense path 214a and a reference path 214b which is substantially matched to the loading conditions of sense path 214a. Array controller 230 is configured to receive an addressing signal 232, and is operable to re-map the address of the sense side 212a of the defective even array column 212 to the even redundancy column 222 and the corresponding reference side 212b to the odd redundancy column 224. The array controller 230 is further operable to re-map the address of the sense side 214a of the defective odd array column 214 to the odd redundancy column 224, and the corresponding reference side 214b to the even redundancy column 222. In this manner, the same CR structure 220 can be used to simultaneously provide replacement columns for two different column defects.

Figure 3B:
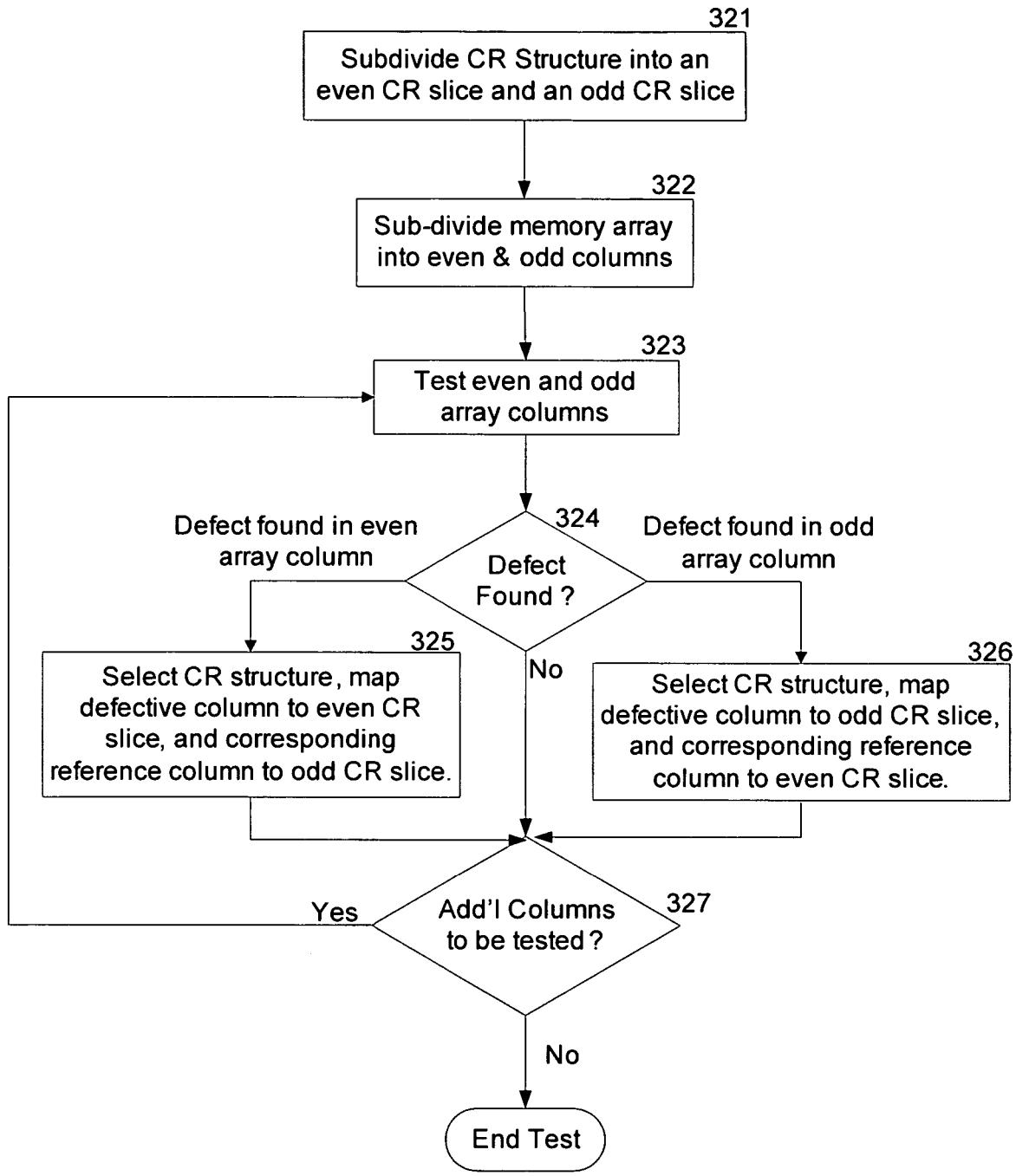
FIG. 3B illustrates a method for column redundancy structure re-use as implemented in the memory device of FIG. 3A.

FIG. 3B illustrates a method for column redundancy structure re-use as implemented in the memory device of FIG. 3A. At 321 and 322, the memory array 210 and CR structure 220 are arranged or sub-divided into first and second (e.g., even and odd) partitions, embodiments of which are described in operations 242 and 244 in FIG. 2B. At 323, a column array (even or odd) is selected and tested to determine the presence of a column defect. If at 324, a determination is made that a defect exists, the operation continues either at 325 or 326, depending upon whether the defective column is a member of the first or even group of columns or a member of the second or odd group of columns. If the defective column is an even array column, e.g., 212, the method continues at 325, whereby an available CR structure 220 is selected, and the array controller 230 maps the address of the sense path 212a to the address of the even CR slice 222, and the address of the corresponding reference path 212b to the address of the odd CR slice 224. In this manner, the entire column 212 is replaced using the even CR slice 222 as the replacement sense path, and the odd CR slice 224 as the replacement reference path. If the defective column is an even array column, e.g., 212, the method continues at 246, whereby the CR structure 220 is selected, and the array controller 230 maps the address of the sense path 212a to the address of the even CR slice 222, and the address of the corresponding reference path 212b to the address of the odd CR slice 224. In this manner, the entire column 212 is replaced using the even CR slice 222 as the replacement sense path, and the odd CR slice 224 as the replacement reference path.

The availability of the CR structure 220 to serve as a replacement for an array column is dependent upon whether it presently serves as a replacement for the same type of array column. For example, if, before operation 325, the CR structure 220 is serving as a replacement for another even array column, a second CR structure is alternatively selected to serve as a replacement for the defective even array column 212. If either the CR structure does not presently serve as a replacement for an array column, or if the CR structure serves as a replacement for an array column of a different type, then it can be used as a replacement for the presently-selected defective column.

Upon completion of processes 325 or 326, or if the selected column is not found to be defective, the process continues at 327 where a determination is made as to whether an additional column is to be tested. If so, the process returns to 323, where the aforementioned operations are repeated. As explained above, a subsequent column replacement operation can be performed using a previously used CR structure when array columns of different types (e.g., even and odd array columns) are replaced. For example, during a first column replacement operation, process 325 will be performed, and during a second column replacement operation, process 326 will be performed using the same CR structure 220.

Those skilled in the art will appreciate that the described architecture and method may be implemented in a variety of ways. As an example, the memory array 210 may be a non-volatile memory, such as an electrically erasable programmable read only memory. Alternatively, the memory array 210 may be implemented as a volatile memory structure such as a dynamic random access (synchronous or non-synchronous) device. In addition, the CR structures 220 may be implemented in a number of different ways, for example, by grouping the even and odd redundancy columns or slices 222 and 224 on opposite sides of the quarter array 210. The memory device 200 may incorporate other memory structures, such as a static random access memory structure used to form the array controller 230. Furthermore, the described processes 321-327 may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A memory device, comprising:
a memory array including a plurality of first array columns and a plurality of second array columns, wherein each of the first and second array columns are coupled to a plurality of memory cells, and wherein each of the first and second array columns are independently addressable;
one or more column redundancy structures coupled to the memory array, each of the one or more column redundancy structures including a first redundancy column and a second redundancy column, wherein each of the first and second redundancy columns are independently addressable; and
an array controller coupled to the memory array and the one or more column redundancy structures, the array controller operable to map the address of a first array column found to be defective to the address of the first redundancy column, and to map the address of a second array column found to be defective to the address of the second redundancy column,
wherein the memory array further comprises a first reference column which substantially matches loading characteristics of one or more of the first array columns, the array controller further operable to map the address of the first reference column to the second redundancy column.

2. The memory device of claim 1, wherein the memory array further comprises a second reference column which substantially matches loading characteristics of one or more of the second array columns, the array controller further operable to map the address of the second reference column to the first redundancy column.

3. The memory device of claim 1, wherein the memory array comprises a non-volatile memory.

4. The memory device of claim 1, wherein the memory array comprises a volatile memory.

5. In a memory device having a memory array and one or more column redundancy structures associated with the memory array, the memory array having a plurality of array columns coupled to a plurality of memory cells, a method for re-using a column redundancy structure to bypass defective array columns, the method comprising:
arranging the memory array into a plurality of addressable first array columns and a plurality of addressable second array columns;
arranging the column redundancy structure into an addressable first redundancy column and an addressable second redundancy column;
replacing a first array column found to be defective during a first column replacement operation by mapping the address of the defective first array column to the address of the first redundancy column; and
replacing a second array column found to be defective during a second column replacement operation by mapping the address of the defective second array column to the address of the second redundancy column,
wherein the memory device further includes a first reference column that substantially matches loading characteristics of the first array column, and wherein replacing the first array column further comprises mapping the address of the first reference column to the address of the second redundancy column.

6. The method of claim 5, wherein the memory device further includes a second reference column which substantially matches loading characteristics of the second array column, and wherein replacing the second array column further comprises mapping the address of the second reference column to the address of the first redundancy column.

7. The method of claim 5, wherein arranging the memory array into the plurality of addressable first array columns and the plurality of addressable second array columns comprises sub-dividing the memory array into a plurality of addressable even array columns and a plurality of addressable odd array columns.

8. The method of claim 5, wherein arranging the column redundancy structure into the addressable first redundancy column and the addressable second redundancy column comprises sub-dividing the column redundancy structure into an addressable even redundancy column and an addressable odd redundancy column.

9. A computer program product, resident on a computer readable medium, operable to store executable instructions for controlling a memory device to re-use a column redundancy structure to bypass defective array columns within a memory array, the computer program product comprising:
instruction code to arrange the memory array into a plurality of addressable first array columns and a plurality of addressable second array columns;
instruction code to arrange the column redundancy structure into an addressable first redundancy column and an addressable second redundancy column;
instruction code to replace a first array column found to be defective during a first column replacement operation by mapping the address of the defective first array column to the address of the first redundancy column; and
instruction code to replace a second array column found to be defective during a second column replacement operation by mapping the address of the defective second array column to the address of the second redundancy column,
wherein the memory device further includes a first reference column which substantially matches loading characteristics of the first array column, and wherein the instruction code to replace the first array column further comprises instruction code to map the address of the first reference column to the address of the second redundancy column.

10. The computer program product of claim 9, wherein the memory device further includes a second reference column which substantially matches loading characteristics of the second array column, and wherein the instruction code to replace the second array column further comprises instruction code to map the address of the second reference column to the address of the first redundancy column.

11. The computer program product of claim 9, wherein the instruction code to arrange the memory array into the plurality of addressable first array columns and the plurality of addressable second array columns comprises instruction code to sub-divide the memory array into a plurality of addressable even array columns and a plurality of addressable odd array columns.

12. The computer program product of claim 9, wherein instruction code to arrange the column redundancy structure into the addressable first redundancy column and the addressable second redundancy column comprises instruction code to sub-divide the column redundancy structure into an addressable even redundancy column and an addressable odd redundancy column.

* * * * *